(12) United States Patent
Ozaki et al.

(10) Patent No.: US 10,056,460 B2
(45) Date of Patent: Aug. 21, 2018

(54) SEMICONDUCTOR DEVICE AND MANUFACTURING METHOD THEREOF

(71) Applicant: FUJITSU LIMITED, Kawasaki-shi, Kanagawa (JP)

(72) Inventors: Shirou Ozaki, Yamato (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/236,707

(22) Filed: Aug. 15, 2016

(65) Prior Publication Data

US 2017/0053990 A1    Feb. 23, 2017

(30) Foreign Application Priority Data

Aug. 18, 2015  (JP) ................ 2015-161314

(51) Int. Cl.

| | |
|---|---|
| *H01L 29/20* | (2006.01) |
| *H01L 29/40* | (2006.01) |
| *H01L 29/205* | (2006.01) |
| *H01L 29/778* | (2006.01) |
| *H01L 29/66* | (2006.01) |
| *H02M 3/335* | (2006.01) |
| *H03F 3/19* | (2006.01) |
| *H03F 1/32* | (2006.01) |
| *H02M 3/337* | (2006.01) |
| *H02M 1/00* | (2006.01) |

(52) U.S. Cl.
CPC ........ *H01L 29/408* (2013.01); *H01L 29/2003* (2013.01); *H01L 29/205* (2013.01); *H01L 29/66462* (2013.01); *H01L 29/7787* (2013.01); *H02M 3/33507* (2013.01); *H03F 1/3247* (2013.01); *H03F 3/19* (2013.01); *H02M 3/337* (2013.01); *H02M 3/33592* (2013.01); *H02M 2001/007* (2013.01); *Y02B 70/1475* (2013.01)

(58) Field of Classification Search
CPC . H01L 29/408; H01L 29/2003; H01L 29/205; H01L 29/7787
See application file for complete search history.

(56) References Cited

U.S. PATENT DOCUMENTS

| | | | |
|---|---|---|---|
| 2002/0160600 A1 | 10/2002 | Eckert et al. | |
| 2007/0173071 A1* | 7/2007 | Afzali-Ardakani | ... C23C 16/401 438/781 |
| 2009/0309221 A1 | 12/2009 | Ozaki et al. | |

FOREIGN PATENT DOCUMENTS

| | | |
|---|---|---|
| JP | 2004-532514 | 10/2004 |
| JP | 2006-273910 | 10/2006 |
| JP | 2007-281516 | 10/2007 |
| JP | 2010-010489 | 1/2010 |
| JP | 5071474 | 11/2012 |

* cited by examiner

*Primary Examiner* — Douglas Menz
(74) *Attorney, Agent, or Firm* — Fujitsu Patent Center

(57) ABSTRACT

A semiconductor device includes: a semiconductor layer; a first insulating film which covers a surface of the semiconductor layer; a first adhering film which is formed on a surface of the first insulating film and contains a carbonyl group; and a second insulating film which covers a surface of the first adhering film and has a lower dielectric constant than the first insulating film.

8 Claims, 12 Drawing Sheets

FORMATION OF CARBONYL GROUP

SEMICONDUCTOR DEVICE AND MANUFACTURING METHOD THEREOF

CROSS-REFERENCE TO RELATED APPLICATION

This application is based upon and claims the benefit of priority of the prior Japanese Patent Application No. 2015-161314, filed on Aug. 18, 2015, the entire contents of which are incorporated herein by reference.

FIELD

The embodiments discussed herein are directed to a semiconductor device and a manufacturing method thereof.

BACKGROUND

There is studied application of a nitride semiconductor, utilizing characteristics such as a high saturation electron velocity and a wide band gap, to a semiconductor device of a high withstand voltage and a high power. For example, a band gap of GaN being the nitride semiconductor is 3.4 eV, which is larger than a band gap (1.1 eV) of Si and a band gap (1.4 eV) of GaAs, and GaN has a high breakdown electric field intensity. Thus, GaN is quite promising as a material of a semiconductor device for a power supply to obtain high voltage operation and a high power.

With regard to a semiconductor device using a nitride semiconductor, many reports are made on a field effect transistor, particularly on a high electron mobility transistor (HEMT). For example, with regard to a HEMT of a GaN system (GaN-HEMT), attention is paid to an AlGaN/GaN HEMT which uses GaN as an electron transit layer and AlGaN as an electron supply layer. In the AlGaN/GaN HEMT, a deformation caused by a lattice constant difference between GaN and AlGaN occurs in AlGaN. By piezoelectric polarization caused by the above and spontaneous polarization of AlGaN, two-dimensional electron gas (2DEG) of a high density is obtained. Therefore, the AlGaN/GaN HEMT is expected as a high withstand voltage electric power device for a high efficiency switch element, an electric vehicle or the like.

Since the HEMT has an excellent high-speed performance, the HEMT is recently applied to a signal processing circuit of an optical communication system, other high-speed digital circuits and the like. The HEMT has an excellent low-noise performance in particular, and application to an amplifier in a microwave or millimeter wave band is also expected. When the amplifier is operated in the millimeter wave band, a high current gain cut-off frequency (fT) is required in order to obtain a sufficient amplifier gain. Therefore, it is necessary not only to improve mutual conductance (gm) being a parameter related to an amplification factor of a transistor but also to reduce a capacitance between a gate and a source by shortening a gate length. Further, when a module is made to be a monolithic microwave integrated circuit (MMIC) in order for miniaturization, a parasitic capacitance occurs due to an interlayer insulating film between wirings. Therefore, it becomes essential to make the interlayer insulating film have a low dielectric constant. Thus, an interlayer insulating film of a low dielectric constant (Low-k insulating film) such as benzocyclobutene (BCB) and polysilazane is applied to an MMIC wiring. Since the Low-k insulating film is low in film density and liable to absorb moisture, it is necessary to hydrophobize a surface to block penetration of water when the Low-k insulating film is used. Thus, there is developed a silica insulating film whose main skeletal structure is methyl silsesquioxane (MSQ) having a methyl group (—$CH_3$) of high water repellency, and application to a MMIC wiring is studied.

[Patent Document 1] Japanese National Publication of International Patent Application No. 2004-532514

[Patent Document 2] Japanese Laid-open Patent Publication No. 2006-273910

[Patent Document 3] Japanese Patent No. 5071474

In addition to the aforementioned water repellency, an adhesion strength sustainable in a rear surface process or a mounting process is also required of the Low-k insulating film. In a case of the silica insulating film, a silane coupling agent is generally used in order to strengthen an adhesiveness to a base. In this method, after the silane coupling agent is made to react to a base surface, a silica insulating film is formed and a heat treatment of about 350° C. to about 400° C. is carried out. Thereby, the silane coupling agent and a hydroxyl group (—OH) contained in the silica insulating film react to each other, so that a siloxane bond (Si—O—Si) is formed in an interface by dehydration/condensation. Consequently, the adhesiveness between the silica insulating film and the base is strengthened. This method is widely used in a field of a silicon LSI.

However, in a case of a semiconductor device of which a low-temperature process is required in fabrication, for example in a case of a HEMT using a compound semiconductor, there is a possibility that a Schottky surface is reformed at a temperature of about 350° C. to about 400° C., leading to deterioration of an electric property. Therefore, it is difficult to apply a silane coupling agent in a conventional method and a new adhesion strengthening technique has been required. Further, in order to strengthen the adhesiveness by a low temperature, though a method of assisting energy necessary to reaction by ultraviolet ray is also effective, a functional group which contributes to reaction is a hydroxyl group in a case of the silane coupling agent. Therefore, an absorption wavelength of ultraviolet ray is as narrow as 200 nm or less, and a rapid effect cannot be expected. Further, there is a problem that a methyl group is desorbed when ultraviolet ray with the absorption wavelength of 200 nm or less is irradiated to a silica insulating film, leading to deterioration of water repellency.

Further, the problem is not only the adhesiveness between the protective film of SiN or the like being the base and the Low-k insulating film, but also peeling due to a low film strength in a neighborhood of a surface of the protective film. The reason why the film strength in the neighborhood of the surface in the protective film is low is that a density is low since a skeletal structure of the film is not formed due to an influence of a dangling bond in the neighborhood of the surface of the protective film. Peeling occurs in the protective film caused by such a region of a low density.

SUMMARY

One embodiment of the semiconductor device includes a semiconductor layer; a first insulating film which covers a surface of the semiconductor layer and contains a structure of a three-membered ring represented by a chemical formula (1); and a second insulating film which covers a surface of the first insulating film.

(1)

One embodiment of the semiconductor device includes: a semiconductor layer; a first insulating film which covers a surface of the semiconductor layer and contains a structure of —C—O—C—; and a second insulating film which covers a surface of the first insulating film.

One embodiment of the manufacturing method of the semiconductor device includes: forming a first insulating film which covers a surface of a semiconductor layer; generating a carbonyl group by subjecting the first insulating film to a treatment; and forming a second insulating film which covers the first insulating film and has a lower dielectric constant than the first insulating film, wherein in the forming the second insulating film, the above-described structure of the three-membered ring is generated in the first insulating film.

One embodiment of the manufacturing method of the semiconductor device includes: forming a first insulating film which covers a surface of a semiconductor layer; generating a carbonyl group by subjecting the first insulating film to a treatment; and forming a second insulating film which covers the first insulating film and has a lower dielectric constant than the first insulating film, wherein in the forming the second insulating film, a structure of —C—O—C— is generated in the first insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

First Embodiment

In the present embodiment, an AlGaN/GaN HEMT of a nitride semiconductor being one type of compound semiconductor is disclosed as a semiconductor device. In the present embodiment, a configuration of the AlGaN/GaN HEMT will be described together with a manufacturing method thereof.

FIG. 1A to FIG. 4 are schematic cross-sectional views illustrating the manufacturing method of the AlGaN/GaN HEMT according to the first embodiment in order of steps.

Figure 1A:
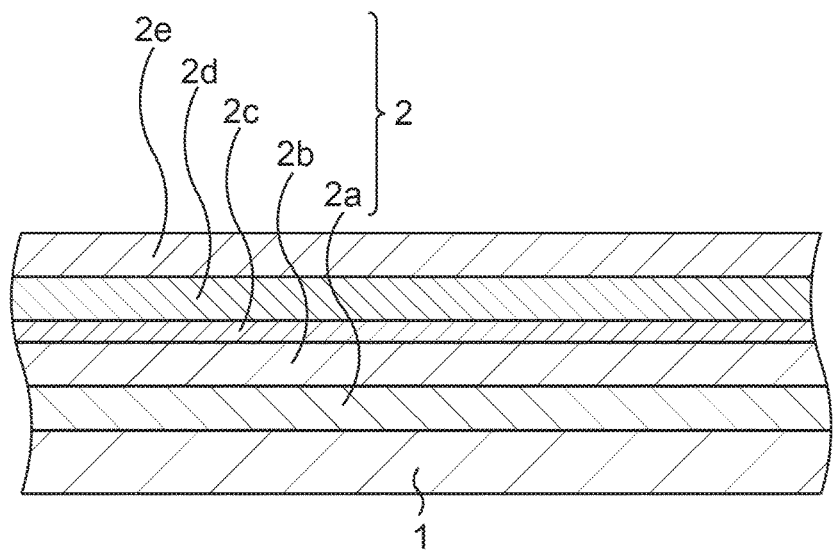
FIG. 1A to FIG. 1C are schematic cross-sectional views illustrating a manufacturing method of an AlGaN/GaN HEMT according to a first embodiment in order of steps.

First, as illustrated in FIG. 1A, a compound semiconductor stacked structure 2 is formed as a compound semiconductor layer for example on a Si substrate 1 as a growth substrate. As the growth substrate, it is possible to use a SiC substrate, a sapphire substrate, a GaAs substrate, a GaN substrate or the like, instead of the Si substrate. Further, with regard to a conductivity of the substrate, whether the substrate is semi-insulating or conductive does not matter.

The compound semiconductor stacked structure 2 is constituted to have a buffer layer 2a, an electron transit layer 2b, an intermediate layer 2c, an electron supply layer 2d and a cap layer 2e.

In the completed AlGaN/GaN HEMT, two-dimensional electron gas (2DEG) occurs in a neighborhood of an interface with the electron supply layer (intermediate layer 2c, exactly) of the electron transfer layer 2d, at a time of operation of the AlGan/Gan HEMT. The 2DEG is generated based on a difference between lattice constants of the compound semiconductor (here, GaN) of the electron transfer layer 2b and the compound semiconductor (here, AlGaN) of the electron supply layer 2d.

In detail, each compound semiconductor below is grown on the Si substrate 1 for example by a metal organic vapor phase epitaxy (MOVPE) method. It is possible to use a molecular beam epitaxy (MBE) method or the like instead of the MOVPE method.

On the Si substrate 1, there are grown AlN in a thickness of about 5 nm, i (intentionally undoped)-GaN in a thickness of about 1 μm, i-AlGaN in a thickness of about 5 nm, n-AlGaN in a thickness of about 30 nm and n-GaN in a thickness of about 3 nm, in sequence. Thereby, the buffer layer 2a, the electron transit layer 2b, the intermediate layer 2c, the electron supply layer 2d and the cap layer 2e are formed. As the buffer layer 2a, AlGaN may be used instead of AlN, or GaN may be grown by low temperature growth.

With regard to a growth condition of AlN, mixed gas of trimethylaluminium (TMA) gas and ammonia ($NH_3$) gas is used as source gas. With regard to a growth condition of GaN, mixed gas of trimethylgallium (TMG) gas and $NH_3$ gas is used as source gas. With regard to a growth condition of AlGaN, mixed gas of TMA gas, TMG gas and $NH_3$ gas is used as source gas. Presence/absence of supply and flow amounts of trimethylaluminium gas being an Al source and trimethylgallium gas being a Ga source are set appropriately in correspondence with a compound semiconductor layer to grow. A flow amount of ammonia gas being a common source is set to be about 100 ccm to 10 LM. Further, a growth pressure is set to be about 50 Torr to 300 Torr, and a growth temperature is set to be about 1000° C. to 1200° C.

In growing GaN and AlGaN as n-type GaN and n-type AlGaN, for example SiH$_4$ gas which contains for example Si is added to the source gas as an n-type impurity at a predetermined flow amount, to dope GaN and AlGaN with Si. A doping concentration of Si is set to be about $1\times10^{18}$/cm$^3$ to about $1\times10^{20}$/cm$^3$, for example about $5\times10^{18}$/cm$^3$.

Figure 1B:
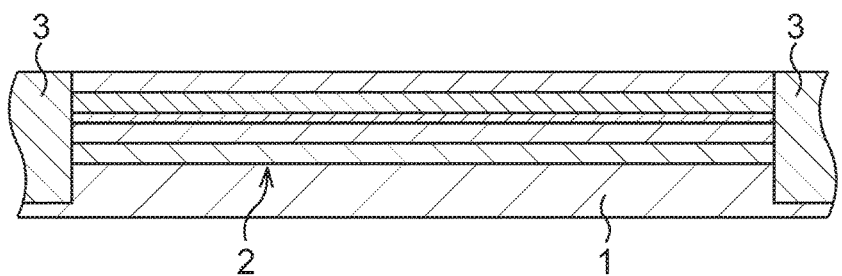

Subsequently, as illustrated in FIG. 1B, an element isolation structure 3 is formed.

In detail, for example argon (Ar) is injected into an element isolation region of the compound semiconductor stacked structure 2. Thereby, the element isolation structure 3 is formed in the compound semiconductor stacked structure 2 and a surface portion of the Si substrate 1. By the element isolation structure 3, an active region is defined on the compound semiconductor stacked structure 2.

Note that element isolation may be carried out for example by using a STI (Shallow Trench Isolation) method, instead of the above-described injection method. On this occasion, for example chlorine-based etching gas is used for dry etching of the compound semiconductor stacked structure 2.

Figure 1C:
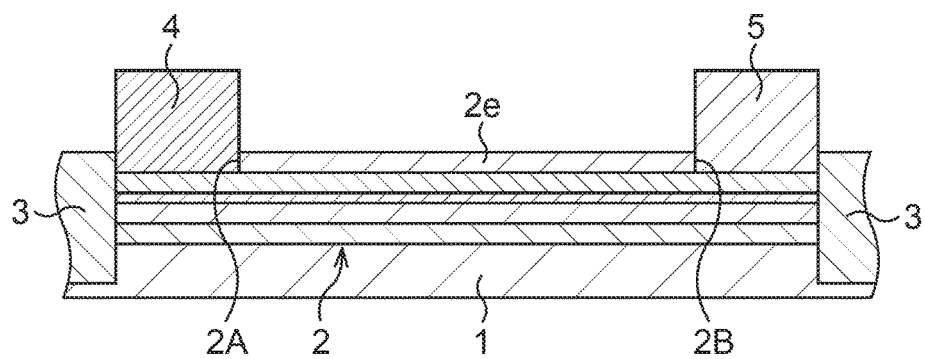

Subsequently, as illustrated in FIG. 1C, a source electrode 4 and a drain electrode 5 are formed.

In detail, first, electrode recesses 2A, 2B are formed in planned formation positions (planned electrode formation positions) of the source electrode and the drain electrode in the surface of the compound semiconductor stacked structure 2.

A resist is applied to the surface of the compound semiconductor stacked structure 2. The resist is processed by lithography, to form openings to expose the surface of the compound semiconductor stacked structure 2 which are equivalent to the planned electrode formation positions, in the resist. From the above, a resist mask which has those openings is formed.

By using this resist mask, the planned electrode formation positions of the cap layer 2e are dry etched and removed until a surface of the electron supply layer 2d is exposed. Thereby, the electrode recesses 2A, 2B to expose the planned electrode formation positions of the surface of the electrode supply layer 2d are formed. With regard to an etching condition, inert gas such as Ar and chlorine-based gas such as Cl$_2$ are used as etching gas, and, for example, a flow amount of Cl$_2$ is set to be 30 sccm, a pressure is set to be 2 Pa and a RF input power is set to be 20 W. Note that the electrode recesses 2A, 2B may be formed by etching to the middle of the cap layer 2e or by etching over the electron supply layer 2d.

The resist mask is removed by an ashing treatment or the like.

A resist mask for forming the source electrode and the drain electrode is formed. Here, there is used for example an eaves-structure two-layer resist which is suitable for a vapor deposition method and a lift-off method. This resist is applied onto the compound semiconductor stacked structure 2 and the openings to expose the electrode recesses 2A, 2B are formed. From the above, the resist mask which has those openings is formed.

By using the above resist mask, for example Ta/Al is deposited as an electrode material on the resist mask including the insides of the openings to expose the electrode recesses 2A, 2B, for example by the vapor deposition method. A thickness of Ta is about 20 nm and a thickness of Al is about 200 nm. The resist mask and Ta/Al deposited thereon are removed by the lift-off method. Thereafter, the Si substrate 1 is subjected to a heat treatment at a temperature of about 400° C. to 1000° C., for example at about 600° C., for example in a nitrogen atmosphere, and remaining Ta/Al is made to have ohmic contact to the electron supply layer 2d. As long as the ohmic contact of Ta/Al to the electron supply layer 2d is obtained, the heat treatment is sometimes unnecessary. From the above are formed the source electrode 4 and the drain electrode 5 made by filling the electrode recesses 2A, 2B with parts of the electrode material.

Figure 2A:
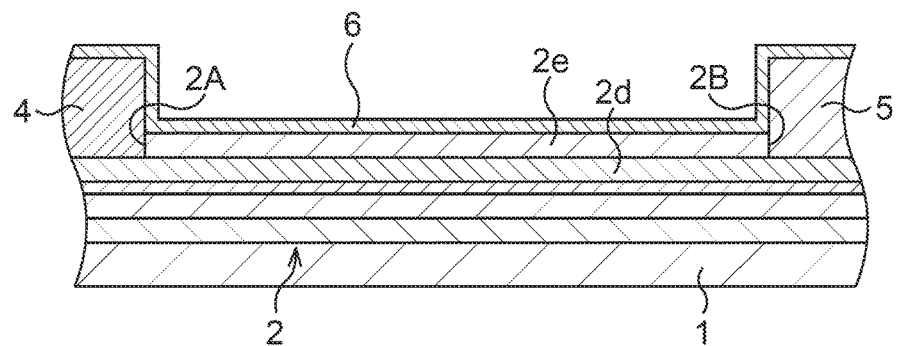
FIG. 2A to FIG. 2C are schematic cross-sectional views illustrating the manufacturing method of the AlGaN/GaN HEMT according to the first embodiment in order of steps, continuously from FIG. 1C.

Subsequently, as illustrated in FIG. 2A, a protective film 6 is formed.

In detail, first, an insulating material is deposited on the compound semiconductor stacked structure 2. The insulating material is an insulating material whose major constituent is a silicon compound which has two elements of Si and C, two elements of Si and N, three elements of Si, C and O, three elements of Si, N and O, or four elements of Si, C, N and O as a major constituent. Concretely, deposition is carried out to have a signal layer of SiC, SiN, SiOC, SiON, SiCON or two layers or more selected from the above. In the present embodiment, as the insulating material, for example SiN is deposited in a single layer. SiN is deposited to have a thickness of about 10 nm to about 100 nm, here, a thickness of about 40 nm, for example by a plasma CVD method.

From the above, the protective film 6 made of SiN which protects the surface of the compound semiconductor stacked structure 2 is formed.

Figure 2B:
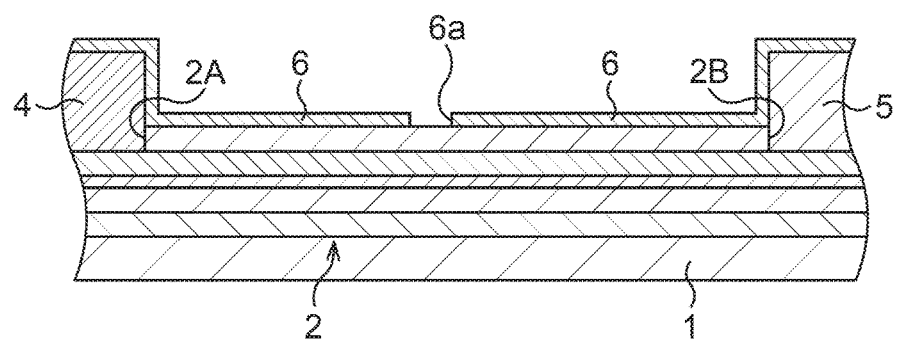

Subsequently, as illustrated in FIG. 2B, a through groove 6a is formed in the protective film 6.

In detail, the protective film 6 is processed by lithography and dry etching. Thereby, in the protective film 6, the through groove 6a to expose a part of the surface of the compound semiconductor stacked structure 2 is formed.

A resist mask used for dry etching is removed by the ashing treatment or the like.

Figure 2C:
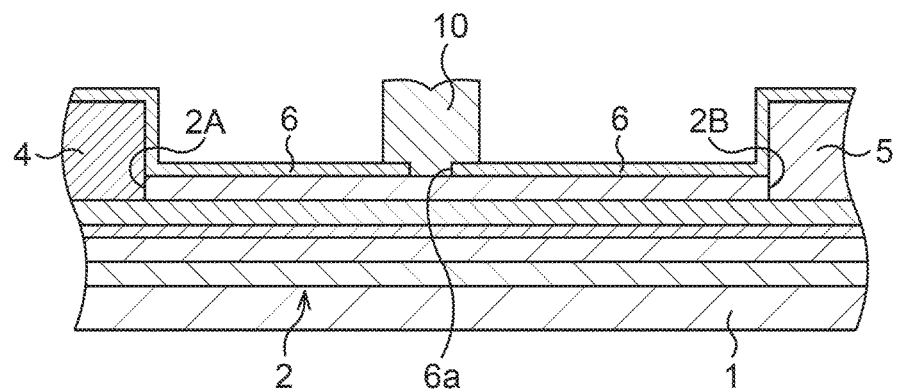

Subsequently, as illustrated in FIG. 2C, a gate electrode 10 is formed.

In detail, first, a resist mask for forming the gate electrode is formed. Here, for example an eaves-structure two-layer resist suitable for a vapor deposition method and a lift-off method is used. This resist is applied onto the protective film 6 and there is formed an opening to expose a bottom surface portion of the through groove 6a in the surface of the compound semiconductor stacked structure 2. From the above, the resist mask which has that opening is formed.

By using the above resist mask, for example Ni/Au is deposited as an electrode material on the resist mask including the inside of the opening to expose the bottom surface portion of the through groove 6a of the compound semiconductor stacked structure 2, for example by the vapor deposition method. A thickness of Ni is about 30 nm, and a thickness of Au is about 400 nm. The resist mask and Ni/Au deposited thereon are removed by the lift-off method. From the above is formed the gate electrode 10 made by filling the inside of the through groove 6a with a part of the electrode material. The gate electrode 10, whose lower part fills the inside of the through groove 6a of the protective film 6, is made to have Schottky contact directly to the compound semiconductor stacked structure 2.

In the present embodiment, though the Schottky type AlGaN/GaN HEMT is exemplified, it is possible to fabricate a MIS type AlGaN/GaN HEMT which has a gate insulating film between a gate electrode 10 and a compound semiconductor stacked structure 2. The gate insulating film is formed by using Al$_2$O$_3$, or a nitride or an oxynitride of Al. The gate insulating film may be formed by other than the above, by an oxide, nitride or oxynitride of Si, Hf, Zr, Ti, Ta, W, or by properly selecting from the above and depositing in multiple layers.

Figure 3A:
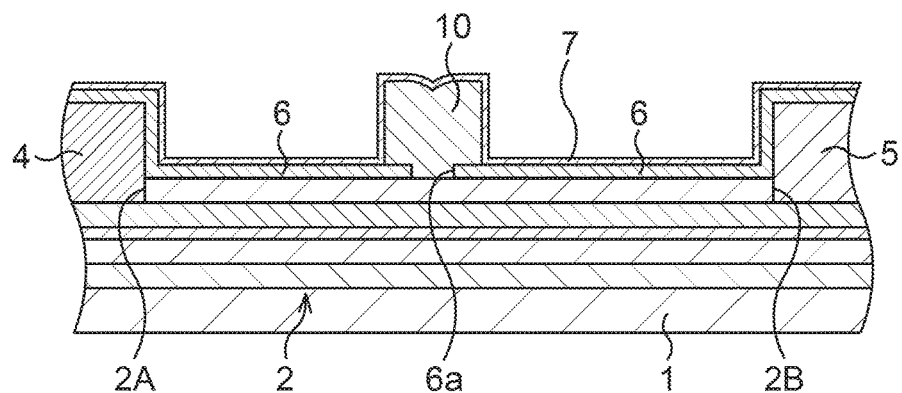
FIG. 3A to FIG. 3C are schematic cross-sectional views illustrating the manufacturing method of the AlGaN/GaN HEMT according to the first embodiment in order of steps, continuously from FIG. 2C.

Subsequently, as illustrated in FIG. 3A, a first insulating film 7 is formed.

In detail, an insulating material is deposited as a transistor protective film in a manner to cover an upside of the protective film 6 and an upside of the gate electrode 10. As the insulating material, a material made of a silicon compound whose major constituents are silicon and at least one element of oxygen and nitrogen is used. Concretely, the insulating material is a material whose major constituent is a silicon compound which has two elements of Si and C, two elements of Si and N, three elements of Si, C and O, three elements of Si, N and O, or four elements of Si, C, N and O as major constituents. For example, deposition is carried out to have a signal layer of SiC, SiN, SiOC, SiON, SiCON or two layers or more selected from the above. In the present embodiment, as the insulating material, for example SiN is deposited in a single layer. SiN is deposited to have a thickness of about 10 nm to about 100 nm, here, a thickness of about 50 nm, for example by a plasma CVD method. From the above, the first insulating film 7 made of SiN, being the transistor protective film, is formed.

With regard to a neighborhood of a surface of the first insulating film 7, alteration statuses thereof by the following steps will be exemplified in FIG. 5A to FIG. 5D.

Figure 5A:
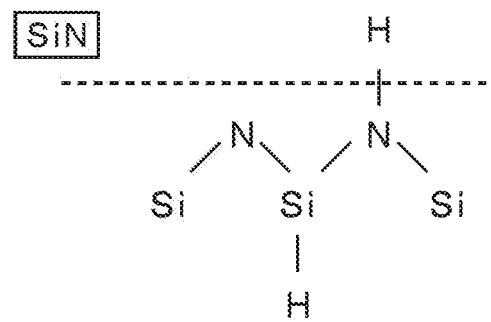
FIG. 5A to FIG. 5D are schematic diagrams illustrating alteration statuses of a neighborhood of a surface of a first insulating film.

As illustrated in FIG. 5A, in a state where the first insulating film 7 is formed as in FIG. 3A, since a skeletal structure is not formed inside the film in the neighborhood of the surface thereof due to an influence of a dangling bond, there exists a low-density region (equivalent to an upside of a broken line).

Figure 3B:
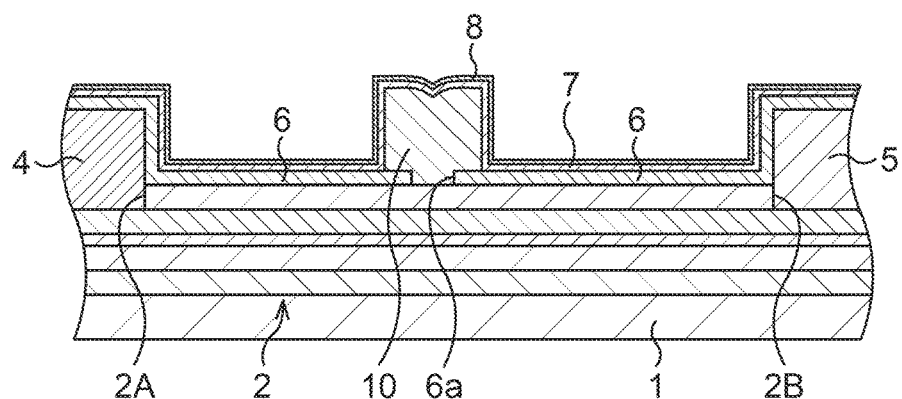

Subsequently, as illustrated in FIG. 3B, the surface of the first insulating film 7 is subjected to a carbonization processing.

In detail, the surface of the first insulating film 7 is subjected to a heat treatment in a carbon dioxide gas atmosphere. The heat treatment is carried out at about 200° C. to about 400° C., here, at about 250° C., for example by ramp annealing. Thereby, the first insulating film 7 is carbonized from the surface. The first insulating film 7 is carbonized from the surface thereof toward the inside in stages. In the illustrated example, a portion which is (can be regarded as being) subjected to the carbonization processing in the neighborhood of the surface of the first insulating film 7 is indicated as a first altered structure 8, for convenience. A thickness of the first altered structure 8 is for example about 1 nm to about 10 nm.

When the temperature of the heat treatment of carbonation is lower than about 200° C., reaction of SiN to carbon dioxide gas is insufficient. When the temperature of the heat treatment is higher than about 400° C., the Schottky surface being the interface between the gate electrode 10 and the compound semiconductor stacked structure 2 is reformed, bringing about deterioration of an electric property. By carrying out the heat treatment at the temperature in a range of about 200° C. to about 400° C., deposited SiN reacts to carbon dioxide gas and the first altered structure 8 which contains a desired carbonyl group is formed.

Figure 5B:
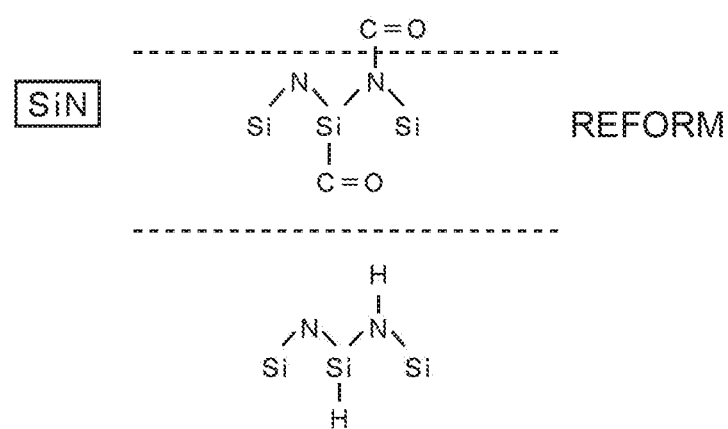

By making carbon dioxide gas flow for example at about 250° C., in the neighborhood of the surface of the first insulating film 7, H is desorbed in Si—H or Si—N—H and a carbonyl group is bonded instead, as illustrated in FIG. 5B. The neighborhood (equivalent to a region between two broken lines) of the surface of the first insulating film 7 at this time comes to be the first altered structure 8.

Figure 3C:
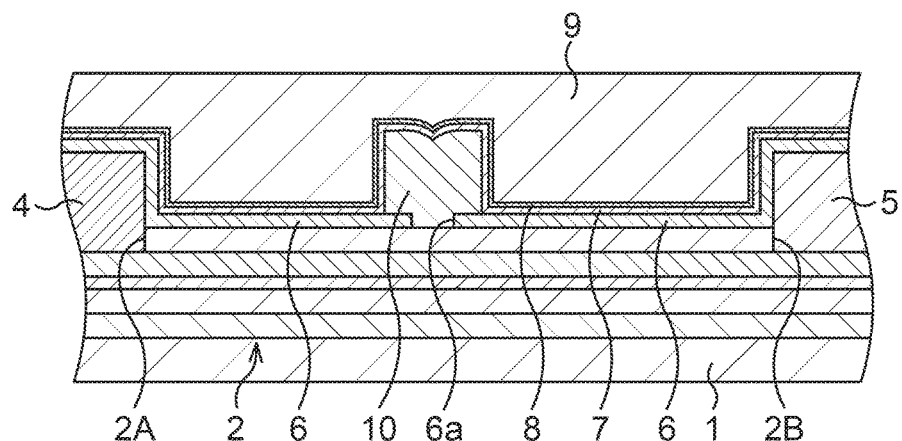

Subsequently, as illustrated in FIG. 3C, a second insulating film 9 is formed.

In detail, a material of a lower dielectric constant (Low-k) than the first insulating film 7 is deposited on a first adhering film 8. As the Low-k material, there is used a silica insulating material which is hydrophobic and made of methyl silsesquioxane that has for example a methyl group (—CH$_3$) with a high water repellency. This silica insulating material is deposited on the first adhering film 8 in a thickness of about 500 nm to about 5000 nm, here, in a thickness of about 2000 nm by a spin coat method.

Figure 5C:
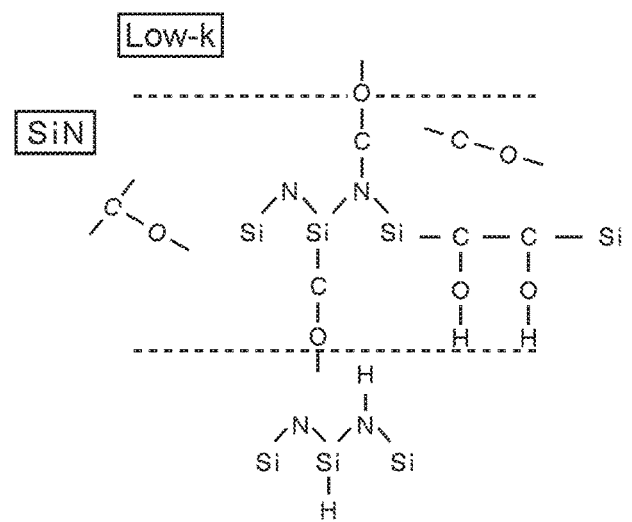

Next, the deposited silica insulating material is subjected to a bake treatment. The silica insulating material is heated by the bake treatment, and in the first altered structure 8, a double bond of the carbonyl group is released and a single bond is made, and when an atom or the like exists nearby, the carbonyl group is bonded to that atom or the like, as illustrated in FIG. 5C. That bond constitutes —C—O—C— being a single bond of a C, O single bond and C mainly of the silica insulating material. In this stage, the first insulating film 7 and the silica insulating material are bonded and an adhesiveness in an interface between the first insulating film 7 and the silica insulating material is improved. Further, —C—O—C— which bonds a reformed portion and an unreformed portion in the first insulating film 7 is generated, so that a bond strength in the first insulating film 7 is improved.

Next, a temperature lowering process of the silica insulating film is carried out. Thereby, the second insulating film 9 made of methyl silsesquioxane which adheres to the first insulating film 7 is formed on the first insulating film 7.

Figure 5D:
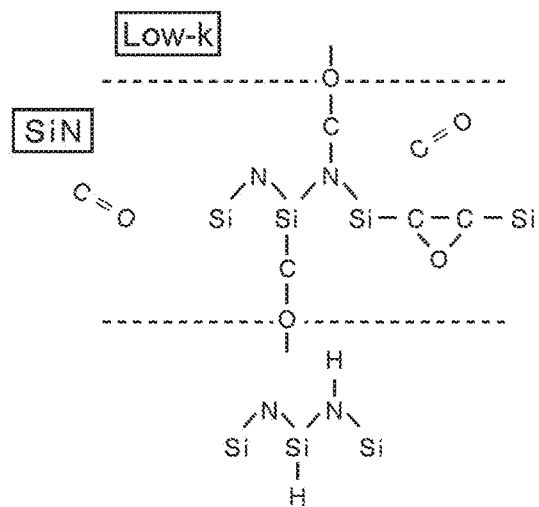

When the temperature of the silica insulating material is being lowered, atoms or the like having been already bonded are kept in that bonding state and ones in a state of the carbonyl group without being bonded are kept in a state of the isolated carbonyl group. In the first altered structure 8, C, O, H bonded to each other in a lower right portion of the first altered structure 8 of FIG. 5C is formed to a following three-membered ring by dehydration/condensation reaction or the like, as illustrated in FIG. 5D. This three-membered ring has a role of bonding an atom or the like which exists therearound in the first insulating film 7 of a low density, and by existence of this three-membered ring, the bond strength in the first insulating film 7 is improved.

(1)

Figure 4:
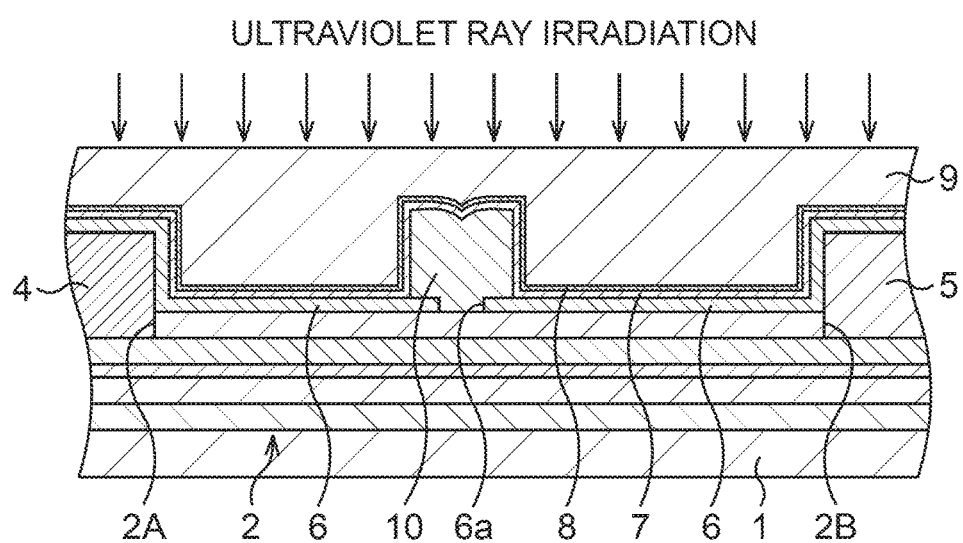
FIG. 4 is a schematic cross-sectional view illustrating the manufacturing method of the AlGaN/GaN HEMT according to the first embodiment continuously from FIG. 3C.

Subsequently, as illustrated in FIG. 4, ultraviolet ray is irradiated to the second insulating film 9.

Figure 6:
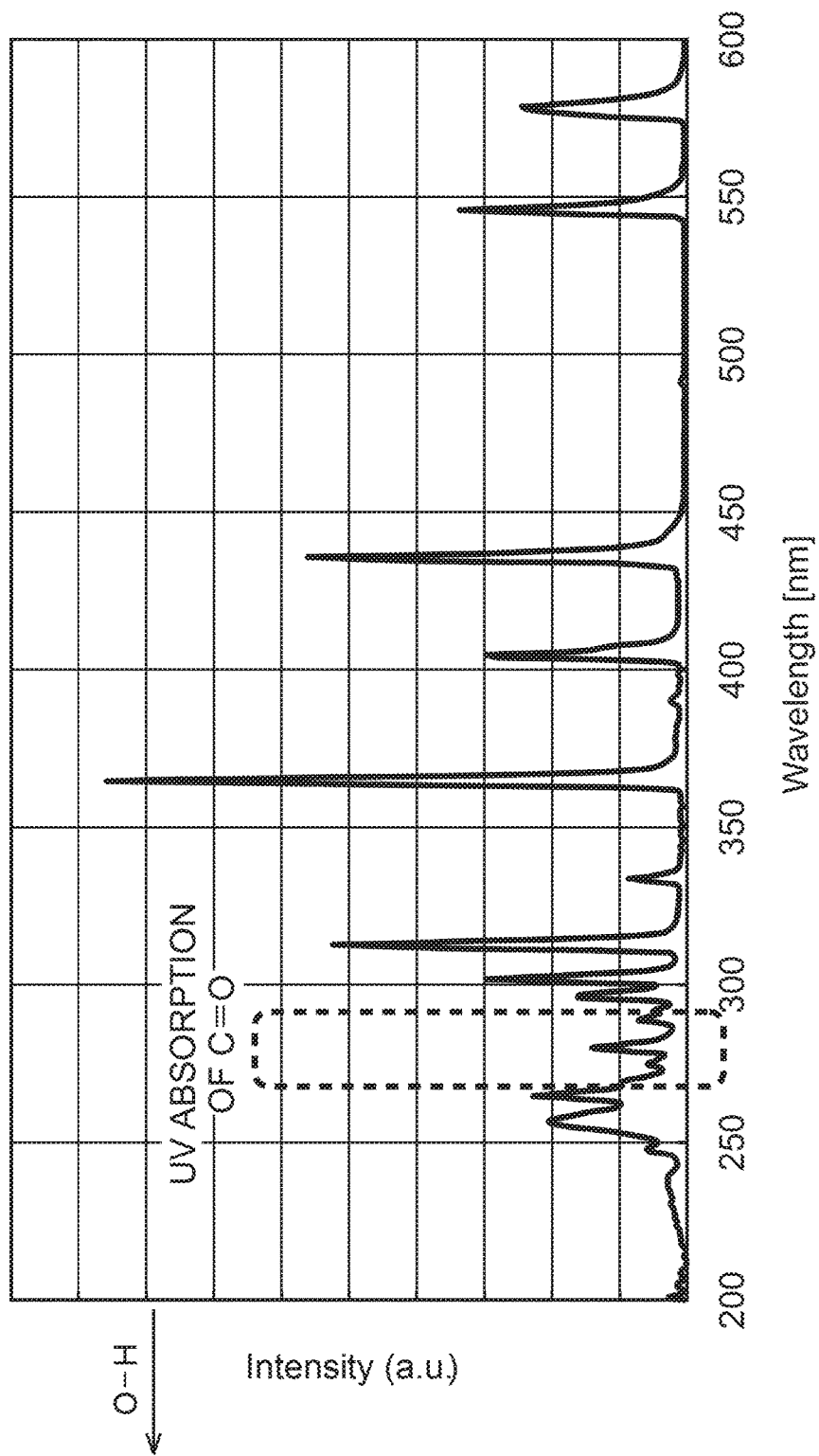
FIG. 6 is a characteristic chart illustrating an absorption wavelength zone of ultraviolet ray of a carbonyl group.

In detail, ultraviolet ray which has a wavelength of about 250 nm to about 300 nm, here, about 254 nm, is irradiated from above the second insulating film 9. A substrate temperature during ultraviolet ray irradiation is for example about 250° C. Thereby, the carbonyl group (bonded portion which remains as the carbonyl group due to insufficient reaction in FIG. 5C and FIG. 5D) of the first altered structure 8 in the first insulting film 7 and for example a hydroxyl group of the second insulating film 9 chemically react to each other, so that the adhesiveness between the first insulating film 7 and the second insulating film 9 is further improved. As illustrated in FIG. 6, the carbonyl group has a property to absorb ultraviolet ray of a wavelength in a range of about 250 nm to about 300 nm by a general and versatile light source (high-pressure mercury lamp or the like). In the present embodiment, by irradiating ultraviolet ray of the wavelength within this range, chemical reaction between the first insulating film 7 and the second insulating film 9 is sufficiently promoted. When the wavelength of ultraviolet ray is about 250 nm or more, desorption of the methyl group from the second insulating film 9 is suppressed.

In the present embodiment, by a covalent bonding structure of —C—O—C— generated in the first altered structure 8, mainly an adhesion strength between the first insulating film 7 and the second insulating film 9 is improved. Further, by a covalent bonding structure of the above-described three-membered ring generated in the first altered structure 8, mainly the bond strength in the first insulating film 7 is improved. Existence of both covalent bonding structure of the —C—O—C and covalent bonding structure of the three-membered ring can be analyzed by using for example a Fourier transform infrared spectrophotometer (FT-IR).

Note that instead of irradiation of ultraviolet ray to the second insulating film 9, a heat treatment may be carried out. A treatment temperature is desirable to be about 200° C. to about 400° C., for example about 250° C., considering that a low temperature process is suitable in fabrication of a compound semiconductor device. By this heat treatment, chemical reaction between the first insulating film 7 and the second insulating film 9 is sufficiently promoted, so that the adhesiveness between the first insulating film 7 and the second insulating film 9 is further improved.

Thereafter, contact holes to expose respective surfaces of the source electrode 4 and the drain electrode 5 are formed in the second insulating film 9, the first insulating film 7 and the protective film 6. Similarly, a contact hole to expose a surface of the gate electrode 10 is formed in the second insulating film 9 and the first insulating film 7. After going through processes such as formation of wirings to be connected to these electrodes, the AlGaN/GaN HEMT according to the present embodiment is formed.

Hereinafter, with regard to an effect by formation of the first adhering film and ultraviolet ray irradiation in the present embodiment, experiment results investigated based on comparison with a comparative example will be described. In the comparative example, formation of a first adhering film or ultraviolet ray irradiation is not carried out, and instead, a silane coupling agent is supplied to a surface of a first insulating film, and a heat treatment is carried out.

In an experiment 1, a SiN film (equivalent to the first insulating film) is formed on a substrate, and in the present embodiment, after formation of a first adhering film on the SiN film and ultraviolet ray irradiation are carried out, a Low-k insulating film (equivalent to the second insulating film) is formed. Meanwhile, in the comparative example, a silane coupling agent is supplied onto the SiN film and the heat treatment is carried out, and thereafter, a Low-k insulating film is formed. A stud pin is fixed on a surface of the Low-k insulating film for example by an epoxy adhesive, a force being applied to an upside, and an adhesion strength between the SiN film and the Low-k insulting film is measured.

In an experiment 2, a SiC film is formed instead of the SiN film, and an adhesion strength between the SiC film and a Low-k insulating film is measured similarly to in the experiment 1.

Figure 7:
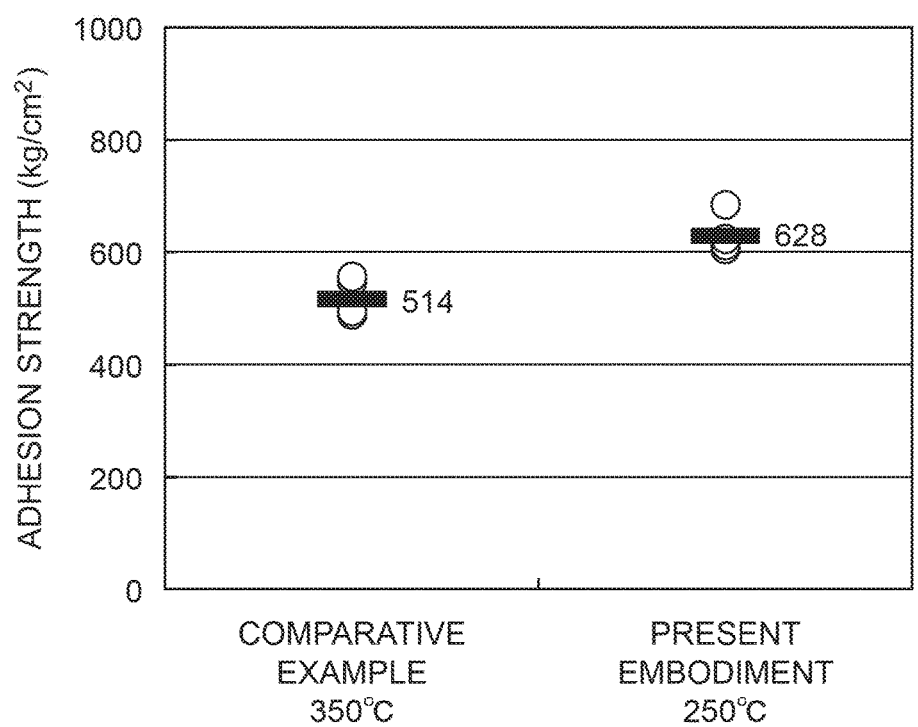
FIG. 7 is a characteristic chart illustrating a result of an experiment 1 in which an adhesion strength is investigated, for the first embodiment.

A result of the experiment 1 is illustrated in FIG. 7. In the experiment 1, a substrate temperature at a time of ultraviolet ray irradiation is about 250° C. in the present embodiment, and a heat treatment temperature is about 350° C. in the comparative example. As illustrated in FIG. 7, in the present embodiment, an adhesion strength superior to that in the comparative example by about 20% is confirmed, in spite of a process of a temperature lower than in the comparative example.

Figure 8:
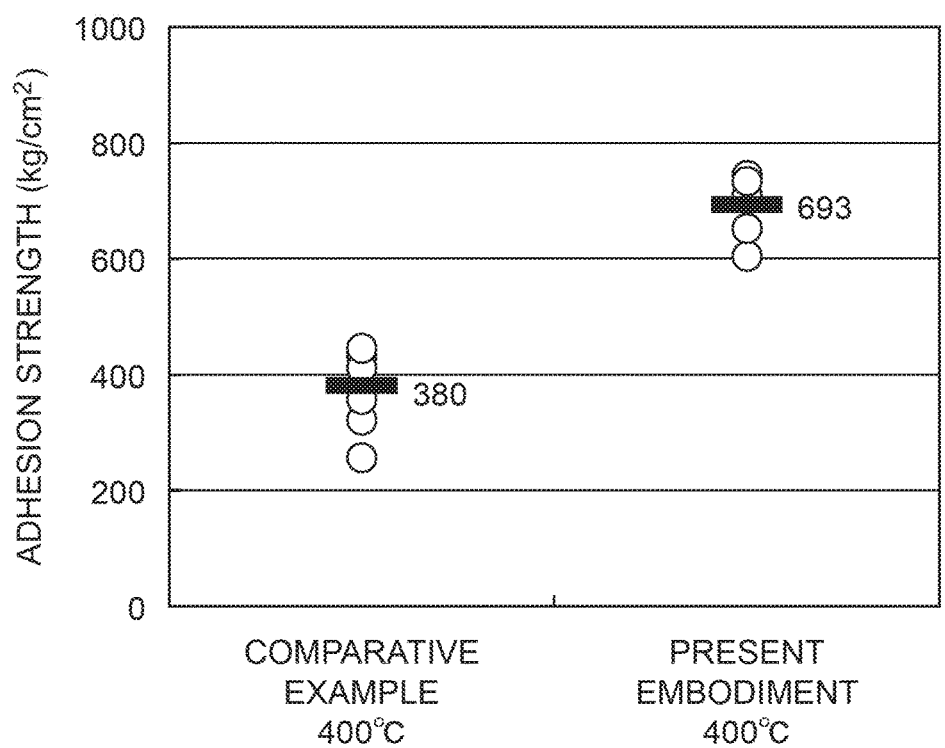
FIG. 8 is a characteristic chart illustrating a result of an experiment 2 in which the adhesion strength is investigated, for the first embodiment.

A result of the experiment 2 is illustrated in FIG. 8. In the experiment 2, a substrate temperature at a time of ultraviolet ray irradiation is about 400° C. in the present embodiment, and a heat treatment temperature is similarly about 400° C. also in the comparative example. As illustrated in FIG. 8, in the present embodiment, a superior adhesion strength, about 1.5 times that in the comparative example, is confirmed.

As described hereinabove, according to the present embodiment, by formation of the first adhering film 8, there is realized a highly reliable AlGaN/GaN HEMT of a high withstand voltage which exhibits a sufficient adhesion strength of the second insulating film 9 of the low dielectric constant to the first insulating film 7 even by the low temperature process and exhibits a sufficient bond strength in the first insulating film 7, and which has a high electric property.

Second Embodiment

In the present embodiment, similarly to in the first embodiment, a configuration and a manufacturing method of an AlGaN/GaN HEMT as a semiconductor device are disclosed, but the present embodiment is different in that an insulating film is further stacked. Note that a component or the like the same as that in the first embodiment is given the same reference numeral, and detailed explanation will be omitted.

Figure 9A:
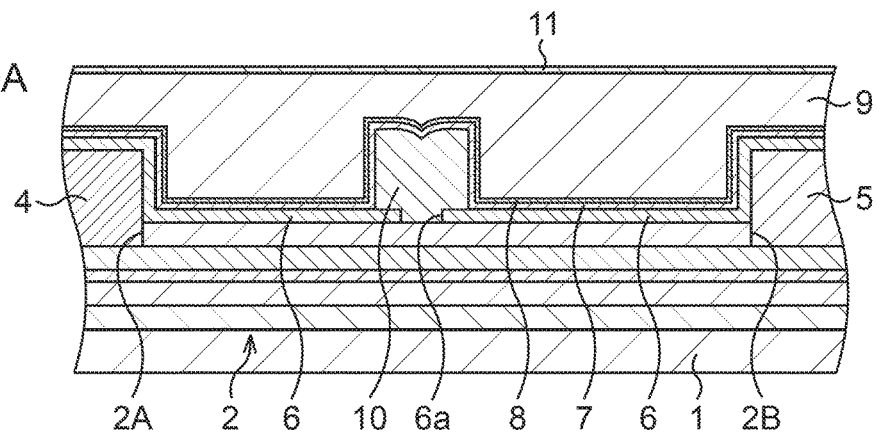
FIG. 9A to FIG. 9C are schematic cross-sectional views illustrating major steps of a manufacturing method of an AlGaN/GaN HEMT according to a second embodiment.
Figure 9B:
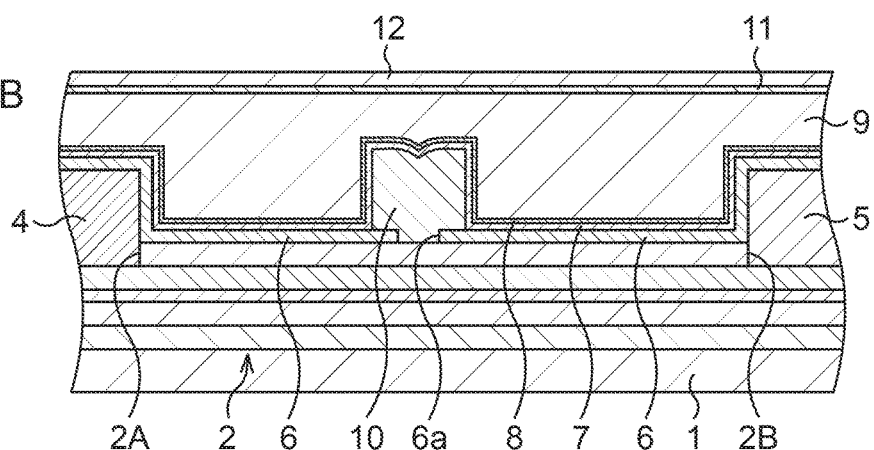
Figure 9C:
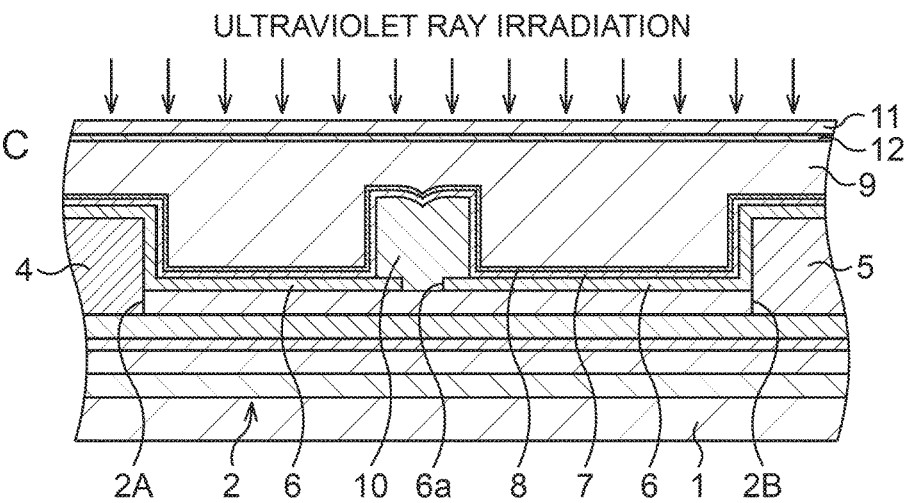

FIG. 9A to FIG. 9C are schematic cross-sectional views illustrating major steps of the manufacturing method of the AlGaN/GaN HEMT according to the second embodiment.

In the present embodiment, similarly to in the first embodiment, steps of FIG. 1A to FIG. 4 are first taken. On this occasion, a first insulating film 7 and a second insulating film 9 are adhesively fixed onto a compound semiconductor stacked structure 2 by the intermediary of a first adhering film 8.

Subsequently, as illustrated in FIG. 9A, a surface of the second insulating film 9 is subjected to a carbonization processing.

In detail, the surface of the second insulating film 9 is subjected to a heat treatment in a carbon dioxide gas atmosphere. The heat treatment is carried out at about 200° C. to about 400° C., here, at about 250° C., for example by ramp annealing. Thereby, the second insulating film 9 is carbonized from the surface. The second insulating film 9 is carbonized from the surface thereof toward the inside in stages. In the illustrated example, a portion which is (can be regarded as being) subjected to the carbonization processing in a neighborhood of the surface of the second insulating film 9 is indicated as a second altered structure 11, for convenience. A thickness of the second altered structure 11 is for example about 1 nm to about 10 nm.

By making carbon dioxide gas flow for example at about 250° C., in the neighborhood of the surface of the second insulating film 9, H is desorbed in Si—H or Si—N—H and a carbonyl group is bonded instead. The neighborhood of the surface of the second insulating film 9 at this time comes to be the second altered structure 11.

Subsequently, as illustrated in FIG. 9B, a third insulating film 12 is formed.

In detail, an insulating material is deposited on a second adhering film 11. As the insulating material, there is used a material made of a silicon compound whose major constituents are silicon and at least one element of oxygen and nitrogen. Concretely, the insulating material is a material whose major constituent is a silicon compound which has two elements of Si and C, two elements of Si and N, three elements of Si, C and O, three elements of Si, N and O, or four elements of Si, C, N and O as major constituents. For example, deposition is carried out to have a signal layer of SiC, SiN, SiOC, SiON, SiCON or two layers or more selected from the above. In the present embodiment, as the insulating material, for example SiN is deposited in a single layer. SiN is deposited in a thickness of about 10 nm to about 100 nm, here, in a thickness of about 50 nm, for example by a plasma CVD method. From the above, the third insulating film 12 made of SiN is formed.

By heating by plasma CVD at a time of deposition of SiN, in the second altered structure 11, a double bond of a carbonyl group is released and a single bond is made, and when an atom or the like exists nearby, the carbonyl group is bonded to that atom or the like. That bond constitutes —C—O—C— being a single bond of a C, O single bond and C mainly of the silica insulating material. In this stage, the second insulating film 9 and SiN are bonded and an adhesiveness in an interface between the second insulating film 7 and SiN is improved. Further, —C—O—C— which bonds a reformed portion and an unreformed portion in the second insulating film 9 is generated, so that a bond strength in the second insulating film 9 is improved.

When a temperature of the formed third insulating film 12 is being lowered, atoms or the like having been already bonded are kept in that bonding state, and ones in a state of the carbonyl group without being bonded are kept in a state of the isolated carbonyl group. In the second altered structure 11, a three-membered ring similar to that represented by the chemical formula (1) in the first embodiment is formed by dehydration/condensation reaction or the like of C, O, H bonded to each other in the second altered structure 11. This three-membered ring has a role of bonding an atom or the like which exists therearound in the second insulating film 9 of a low density, and by existence of this three-membered ring, the bond strength in the second insulating film 9 is improved.

Subsequently, as illustrated in FIG. 9C, ultraviolet ray is irradiated to the third insulating film 12.

In detail, ultraviolet ray which has a wavelength of about 250 nm to about 300 nm, here, about 254 nm, is irradiated from above the third insulating film 12. A substrate temperature during ultraviolet ray irradiation is for example about 250° C. Thereby, the carbonyl group (which remains in the second altered structure 11) of the second altered structure 11 in the second insulting film 9 and for example a NH group, a SiH group or a hydroxyl group of the third insulating film 12 chemically react to each other, so that the adhesiveness between the second insulating film 9 and the third insulating film 12 are further improved. The carbonyl group has a property to absorb a wavelength in a range of about 250 nm to about 300 nm by a general and versatile light source (high-pressure mercury lamp or the like). In the present embodiment, by irradiating ultraviolet ray of the wavelength within this range, chemical reaction between the second insulating film 9 and the third insulating film 12 is sufficiently promoted. When the wavelength of ultraviolet ray is about 250 nm or more, desorption of a methyl group from the second insulating film 9 is suppressed.

In the present embodiment, by a covalent bonding structure of —C—O—C— generated in the second altered structure 11, mainly an adhesion strength between the second insulating film 9 and the third insulating film 12 is improved. Further, by a covalent bonding structure of the above-described three-membered ring generated in the second altered structure 11, mainly the bond strength in the second insulating film 9 is improved.

In the present embodiment, a case where ultraviolet treatment is carried out twice is exemplified, but the first ultraviolet treatment similar to that illustrated in FIG. 4 of the first embodiment may be omitted and only the ultraviolet treatment of FIG. 9C may be carried out.

Note that instead of irradiation of ultraviolet ray to the third insulating film 12, a heat treatment may be carried out. A treatment temperature is desirable to be about 200° C. to about 400° C., for example about 250° C., considering that a low temperature process is suitable in fabrication of a compound semiconductor device. By this heat treatment, chemical reaction between the second insulating film 9 and the third insulating film 12 is sufficiently promoted, so that the adhesiveness between the second insulating film 9 and the third insulating film 12 is further improved.

Thereafter, contact holes to expose respective surfaces of a source electrode 4 and a drain electrode 5 are formed in the third insulating film 12, the second insulating film 9, the first insulating film 7 and the protective film 6. Similarly, a contact hole to expose a surface of a gate electrode 10 is formed in the third insulating film 12, the second insulating film 9 and the first insulating film 7. After going through processes such as formation of wirings to be connected to these electrodes, the AlGaN/GaN HEMT according to the present embodiment is formed.

As described hereinabove, according to the present embodiment, the second adhering film 11 is formed in addition to the first adhering film 8. Thereby, there is realized a highly reliable AlGaN/GaN HEMT of a high withstand voltage which exhibits a sufficient adhesion strength of the second insulating film 9 of a low dielectric constant to the first insulating film 7 even by a low temperature process and exhibits a sufficient bond strength in the first insulating film 7, and further, exhibits a sufficient adhesion strength of the third insulating film 12 to the second insulating film 9 and exhibits a sufficient bond strength in the second insulating film 9, and which has a high electric property.

Third Embodiment

In the present embodiment, there is disclosed a power supply device to which one type of AlGaN/Gan HEMT selected from the first and second embodiments is applied.

Figure 10:
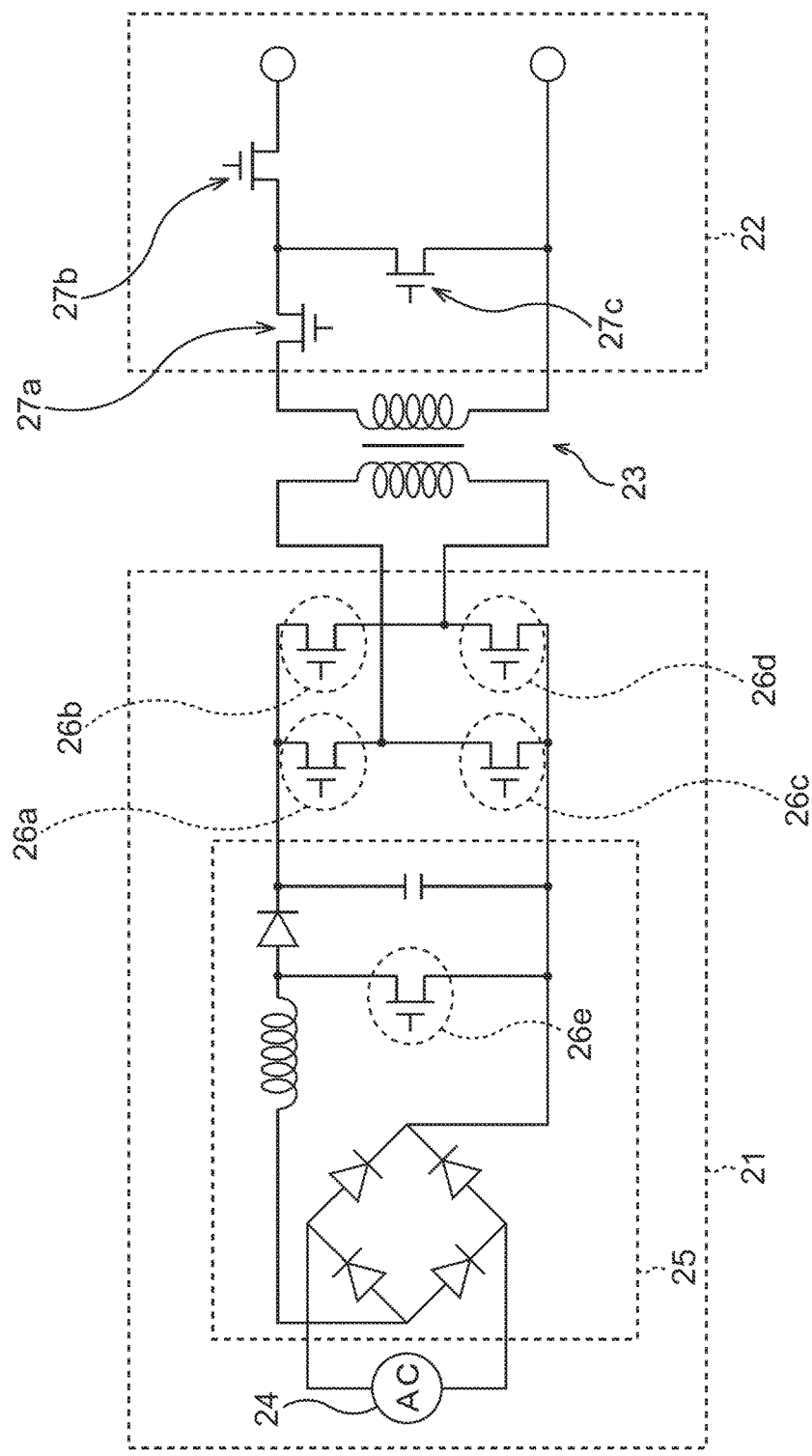
FIG. 10 is a connection diagram illustrating a schematic configuration of a power supply device according to a third embodiment.

FIG. 10 is a connection diagram illustrating a schematic configuration of the power supply device according to the third embodiment.

The power supply device according to the present embodiment is constituted to have a high-voltage primary-side circuit 21 and a low-voltage secondary-side circuit 22, and a transformer 23 disposed between the primary-side circuit 21 and the secondary-side circuit 22.

The primary-side circuit 21 is constituted to have an AC power supply 24, what is called a bridge rectifying circuit 25 and a plurality of (here, four) switching elements 26a, 26b, 26c, 26d. Further, the bridge rectifying circuit 25 has a switching element 26e.

The secondary-side circuit 21 is constituted to have a plurality of (here, three) switching elements 27a, 27b, 27c.

In the present embodiment, the switching elements 26a, 26b, 26c, 26d of the primary-side circuit 21 are the one type of AlGaN/GaN HEMTs selected from the first and second embodiments. Meanwhile, the switching elements 27a, 27b, 27c of the secondary-side circuit 22 are ordinary MIS FETs using silicon.

In the present embodiment, applied to the high-voltage circuit is the highly reliable AlGaN/GaN HEMT of the high withstand voltage which exhibits the sufficient adhesion strength between the first insulating film and the second insulating film even by the low temperature process and exhibits the sufficient bond strength in the first insulating film, and which has the high electric property. Thereby, a highly reliable power supply circuit with large power is realized.

Fourth Embodiment

In the present embodiment, there is disclosed a high frequency amplifier to which one type of AlGaN/GaN HEMT selected from the first and second embodiments is applied.

Figure 11:
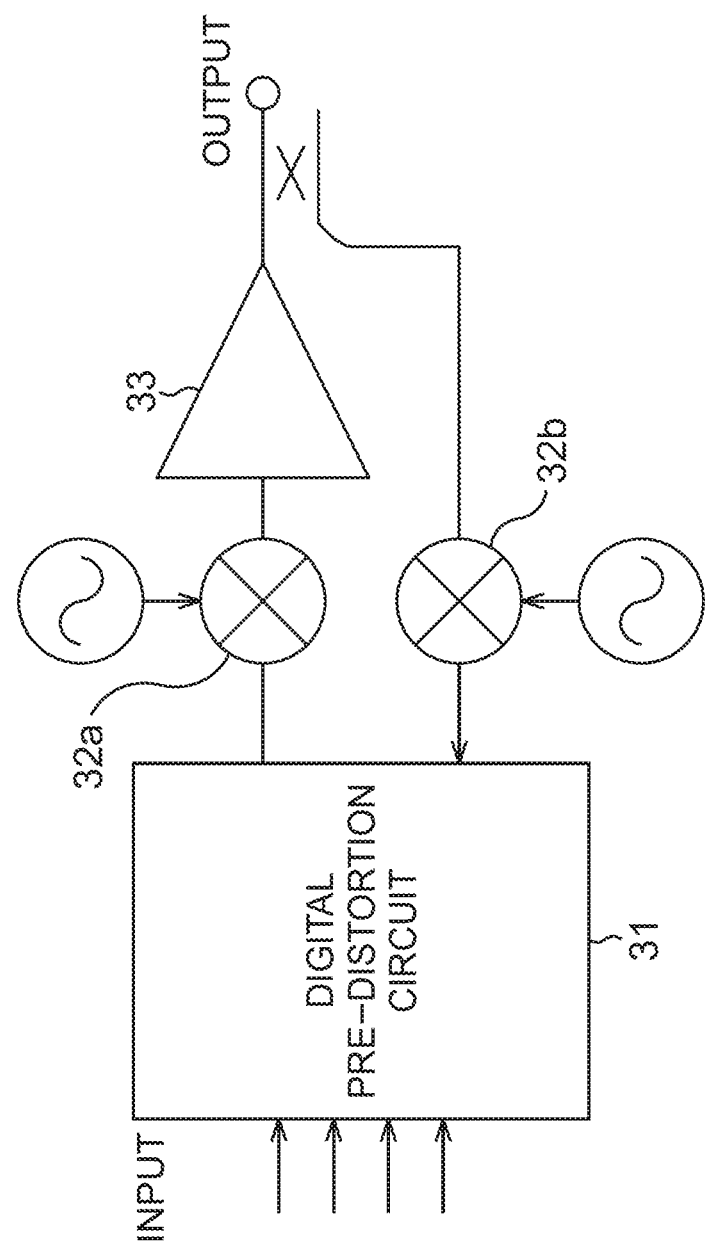
FIG. 11 is a connection diagram illustrating a schematic configuration of a high frequency amplifier according to a fourth embodiment.

FIG. 11 is a connection diagram illustrating a schematic configuration of the high frequency amplifier according to the fourth embodiment.

The high frequency amplifier according to the present embodiment is constituted to have a digital pre-distortion circuit 31, mixers 32a, 32b and a power amplifier 33.

The digital pre-distortion circuit 31 compensates a non-linear distortion of an input signal. The mixer 32a mixes the input signal whose nonlinear distortion has been compensated and an AC signal. The power amplifier 33 amplifies the input signal mixed with the AC signal, and has the one type of AlGaN/GaN HEMT selected from the first and second embodiments. Note that in FIG. 11, the high frequency amplifier has a configuration in which, for example by switching of a switch, a signal on an output side can be mixed with the AC signal by the mixer 32b and can be sent to the digital pre-distortion circuit 31.

In the present embodiment, applied to the high frequency amplifier is the highly reliable AlGaN/GaN HEMT of the high withstand voltage which exhibits the sufficient adhesion strength between the first insulating film and the second insulating film even by the low temperature process and exhibits the sufficient bond strength in the first insulating film, and which has the high electric property. Thereby, a highly reliable high frequency amplifier of a high withstand voltage is realized.

The compound semiconductor devices represented by the HEMTs are exemplified in the above-described first and second embodiments, but without being limited thereto, the embodiments can be also applied to for example a silicon LSI or the like, as long as the embodiment is applied to a semiconductor device which requires a low temperature process in fabrication.

OTHER EMBODIMENTS

In the first and second embodiments, the AlGaN/GaN HEMTs are exemplified as the compound semiconductor devices. The embodiments can be applied also to following HEMTs other than the AlGan/GaN HEMT, as the compound semiconductor device.

Another HEMT Example 1

In the present example, an InAlN/GaN HEMT is disclosed as a compound semiconductor device.

InAlN and GaN are compound semiconductors whose lattice constants can be made close by composition. In this case, in the above-described first to fourth embodiments, the electron transit layer is formed of i-GaN, the intermediate layer is formed of i-InAlN, the electron supply layer is formed of n-InAlN, and the cap layer is formed of n-GaN. Further, since piezoelectric polarization hardly occurs in this case, two-dimensional gas mainly occurs by spontaneous polarization of InAlN.

According to the present example, similarly to a case of the aforementioned AlGaN/GaN HEMT, there is realized a highly reliable InAlN/GaN HEMT of a high withstand voltage which exhibits a sufficient adhesion strength between a first insulating film and a second insulating film even by a low temperature process and exhibits a sufficient bond strength in the first insulating film, and which has a high electric property.

Another HEMT Example 2

In the present example, an InAlGaN/GaN HEMT is disclosed as a compound semiconductor device.

GaN and InAlGaN are compound semiconductors, and a lattice constant of InAlGaN can be made smaller than that of GaN by composition. In this case, in the above-described first to fourth embodiments, the electron transit layer is formed of i-GaN, the intermediate layer is formed of i-InAlGaN, the electron supply layer is formed of n-InAlGaN, and the cap layer is formed of n-GaN.

According to the present example, similarly to a case of the aforementioned AlGaN/GaN HEMT, there is realized a highly reliable InAlGaN/GaN HEMT of a high withstand voltage which exhibits a sufficient adhesion strength between a first insulating film and a second insulating film even by a low temperature process and exhibits a sufficient bond strength in the first insulating film, and which has a high electric property.

According to the above-described embodiments, there is realized a highly reliable semiconductor device which exhibits a sufficient adhesion strength between a first insulating film and a second insulating film even by a low temperature process and exhibits a sufficient bond strength in the first insulating film, and which has a high electric property.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a semiconductor layer;
   a first insulating film which covers a surface of the semiconductor layer and has an altered structure formed only on a surface of the first insulating film containing a structure of a three-membered ring represented by a chemical formula (1);

and a second insulating film which covers the surface of the first insulating film

 (1)

2. The semiconductor device according to claim 1, wherein a single bond of C—O—C— is formed between C, O of the first insulating film and C of the second insulating film.

3. The semiconductor device according to claim 1, wherein the structure of the three-membered ring is of covalent bonding.

4. The semiconductor device according to claim 2, wherein the structure of C—O—C— is of covalent bonding.

5. The semiconductor device according to claim 1, further comprising
a third insulating film which covers a surface of the second insulating film.

6. The semiconductor device according to claim 5, wherein the second insulating film contains a structure of a three-membered ring represented by the above chemical formula (1).

7. The semiconductor device according to claim 5, wherein the second insulating film contains a structure of —C—O—C—.

8. The semiconductor device according to claim 1, wherein the first insulating film is made of a silicon compound whose major constituents are silicon and at least one element of oxygen and nitrogen.

* * * * *